United States Patent
Derat et al.

(10) Patent No.: US 10,848,252 B1
(45) Date of Patent: Nov. 24, 2020

(54) METHOD AND SYSTEM FOR NEAR-FIELD RECONSTRUCTION IN INDIRECT FAR-FIELD SYSTEMS

(71) Applicant: Rohde & Schwarz GmbH & Co. KG, Munich (DE)

(72) Inventors: Benoit Derat, Munich (DE); Corbett Rowell, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/600,119

(22) Filed: Oct. 11, 2019

(30) Foreign Application Priority Data

Jul. 11, 2019 (EP) ..................................... 19185635

(51) Int. Cl.
  *H04B 17/10* (2015.01)
  *H04B 17/309* (2015.01)
  *H01Q 15/14* (2006.01)
  *H04B 17/11* (2015.01)

(52) U.S. Cl.
  CPC ........... *H04B 17/309* (2015.01); *H01Q 15/14* (2013.01)

(58) Field of Classification Search
  CPC . H04B 17/102; H04B 17/391; H04B 17/0085

USPC ....................................................... 455/67.12
See application file for complete search history.

(56) References Cited

U.S. PATENT DOCUMENTS

| | | | |
|---|---|---|---|
| 4,201,987 A * | 5/1980 | Tricoles | G01R 29/10 343/703 |
| 8,750,354 B1 | 6/2014 | Heruska et al. | |
| 9,991,591 B1 * | 6/2018 | Rowell | H01Q 3/267 |

FOREIGN PATENT DOCUMENTS

CN   107271977 A   10/2017

* cited by examiner

*Primary Examiner* — Lee Nguyen
(74) *Attorney, Agent, or Firm* — Ditthavong & Steiner P.C.

(57) ABSTRACT

A method for near-field reconstruction in indirect far-field systems is provided. The method comprises the steps of measuring a reference antenna for orthogonal field components in a direct spherical near-field system at a well geometrically defined distance ($R_0$), measuring the reference antenna for orthogonal field components in an indirect far-field system and optimizing the orthogonal field components in the indirect far-field system with respect to the orthogonal field components in the direct spherical near-field system.

13 Claims, 6 Drawing Sheets

Measured Near-Field E-Field        Generated Far-Field E-Field

METHOD AND SYSTEM FOR NEAR-FIELD RECONSTRUCTION IN INDIRECT FAR-FIELD SYSTEMS

PRIORITY

This application claims priority of European patent application EP 19 185 635.0 filed on Jul. 11, 2019, which is incorporated by reference herewith.

FIELD OF THE INVENTION

The invention relates to a method and a corresponding system for near-field reconstruction in indirect far-field systems, especially for compact antenna test ranges (CATR) that are used to enable stable far-field conditions in a compact test environment.

BACKGROUND OF THE INVENTION

The over the air (OTA) measurements attempt to determine the performance of radio transmitters and receivers (e.g. mobile phones) in a test environment that closely simulate the conditions in which the devices will be tested. For instance, a fifth generation millimeter-wave (5G mmWave) device operating above 24 GHz incorporates millimeter sized antenna arrays or dipole antennas, which become an integral part of the device module packaging. Thus, the only way to characterize and test the performance of the antennas as part of the final product is via OTA measurement.

For example, U.S. Pat. No. 8,750,354 B1 describes a method of scanning a digital beam formed phased array in a nearfield by creating an open architecture approach to replacing the analog reference points with digital reference points and the ability to perform measurements.

Accordingly, there is a need to provide a method and a system for near-field reconstruction in indirect far-field systems, especially by combining both indirect far-field and near-field approaches in order to gain the aforementioned advantages from both approaches.

SUMMARY OF THE INVENTION

According to a first aspect of the invention, a method for near-field reconstruction in indirect far-field systems is provided. The method comprises the steps of measuring a reference antenna for orthogonal field components in a direct spherical near-field system at a well geometrically defined distance, measuring the reference antenna for orthogonal field components in an indirect far-field system and optimizing the orthogonal field components in the indirect far-field system with respect to the orthogonal field components in the direct spherical near-field system. Therefore, the near-field approach and the indirect far-field approach are advantageously combined in order to reconstruct near-field in an indirect far-field system.

According to a first preferred implementation form of said first aspect of the invention, the method further comprises the step of applying a Fourier transformation in order to transform the orthogonal field components in the direct spherical near-field system at other distances. Advantageously, near-field to far-field and/or near-field to near-field algorithms can be used to extrapolate the near-field measurements and thereby increasing the side lobe level accuracy significantly.

According to a second preferred implementation form of said first aspect of the invention, the method further comprises the step of identifying an equivalent distance such that the orthogonal field components measured in the indirect far-field system are closest to the transformed orthogonal field components in the direct spherical near-field system. Advantageously, the equivalent distance, at which the field is measured in the indirect far-field system, is identified in a simplified manner in order to perform near-field transformations.

According to a further preferred implementation form of said first aspect of the invention, the method further comprises the step of transforming the orthogonal field components in terms of magnitude and phase by utilizing the equivalent distance of the indirect far-field system. Advantageously, the additional phase information along with magnitude enables the most accurate evaluation of the field patterns especially in nulls and side lobes.

According to a further preferred implementation form of said first aspect of the invention, the method further comprises the step of calculating near-field currents in the reactive near-field of the reference antenna by forward and/or back propagating the transformed amplitude and phase of the indirect far-field system. Advantageously, the near-field currents obtained in the reactive near-field of the reference antenna allows to identify critical antenna design parameters, for instance antenna design defects, specific absorption rate (SAR) and so on.

According to a second aspect of the invention, a system for near-field reconstruction in indirect far-field systems is provided. The system comprises a measuring antenna, a measuring unit and a processing unit. In this context, the measuring unit is adapted to measure a reference antenna for orthogonal field components in a direct spherical near-field system at a well geometrically defined distance. The measuring unit is further adapted to measure the reference antenna for orthogonal field components in an indirect far-field system. In addition, the processing unit is adapted to optimize the orthogonal field components in the indirect far-field system with respect to the orthogonal field components in the direct spherical near-field system.

Hence, the reference antenna is characterized for each relevant field components, for example $E_\theta$, $E_\varphi$ in the direct spherical near-field system at a defined distance. The indirect far-field system is supposed, for instance as a CATR where the reference antenna is further characterized for the field components patterns. Therefore, the near-field approach and the indirect far-field approach are advantageously combined in order to reconstruct near-field in an indirect far-field system.

According to a first preferred implementation form of said second aspect of the invention, the processing unit is further adapted to apply a Fourier transformation in order to transform the orthogonal field components in the direct spherical near-field system at other distances. Hence, near-field to far-field (NF/FF) and/or near-field to near-field (NF/NF) algorithms can be used to transform the measured field components, for example $E_\theta$, $E_\varphi$ at other distances that are preferably not equal to the defined distance where the reference antenna is previously characterized in the direct spherical near-field system. Advantageously, NF/FF and/or NF/NF algorithms can be used to extrapolate the near-field measurements and thereby increasing the side lobe level accuracy significantly.

According to a second preferred implementation form of said second aspect of the invention, the processing unit is further adapted to identify an equivalent distance such that the orthogonal field components measured in the indirect far-field system are closest to the transformed orthogonal field components in the direct spherical near-field system. Advantageously, the equivalent distance at which the field is measured in the indirect far-field system is identified in a simplified manner in order to perform near-field transformations.

According to a further preferred implementation form of said second aspect of the invention, the equivalent distance corresponds to the equivalent range length of the indirect far-field system. Advantageously, additional power measurements, for instance total radiated power, time-averaged power density and so on can be performed with ease by knowing the equivalent range length of the indirect far-field system.

According to a further preferred implementation form of said second aspect of the invention, the processing unit is further adapted to transform the orthogonal field components in terms of magnitude and phase by utilizing the equivalent distance of the indirect far-field system. Advantageously, the additional phase information along with magnitude enables the most accurate evaluation of the field patterns especially in nulls and side lobes.

According to a further preferred implementation form of said second aspect of the invention, the processing unit is further adapted to calculate near-field currents in the reactive near-field of the reference antenna by forward and/or back propagating the transformed amplitude and phase of the indirect far-field system. Advantageously, the near-field currents obtained in the reactive near-field of the reference antenna allows to identify critical antenna design parameters, for instance antenna design defects, specific absorption rate (SAR) and so on.

According to a further preferred implementation form of said second aspect of the invention, the system further comprises a turntable adapted rotate the reference antenna relative to the measuring antenna along at least two axis. Advantageously, the field components, for example $E_\theta$, $E_\varphi$ are measured with greater accuracy.

According to a further preferred implementation form of said second aspect of the invention, the system further comprises a reflector, preferably a shaped reflector. The reflector provides the means to convert a spherical phase front to and/or from the measuring antenna into a planar phase front close to the aperture. Such an approach advantageously allows a compact range that creates a plane wave field at distances considerably shorter than those needed under conventional far-field criteria.

According to a further preferred implementation form of said second aspect of the invention, the system further comprises a positioning unit adapted to control the turntable rotation and the spatial position of the reflector. Advantageously, the measurement accuracy is further improved.

According to a further preferred implementation form of said second aspect of the invention, the system further comprises an anechoic chamber encompassing the reference antenna, the measuring antenna, the turntable and the reflector.

Advantageously, the standing wave reduction capability of the anechoic chamber greatly improves the OTA measurement reliability.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Reference will now be made in detail to the embodiments of the present invention, examples of which are illustrated in the accompanying drawings. However, the following embodiments of the present invention may be variously modified and the range of the present invention is not limited by the following embodiments.

Figure 1:
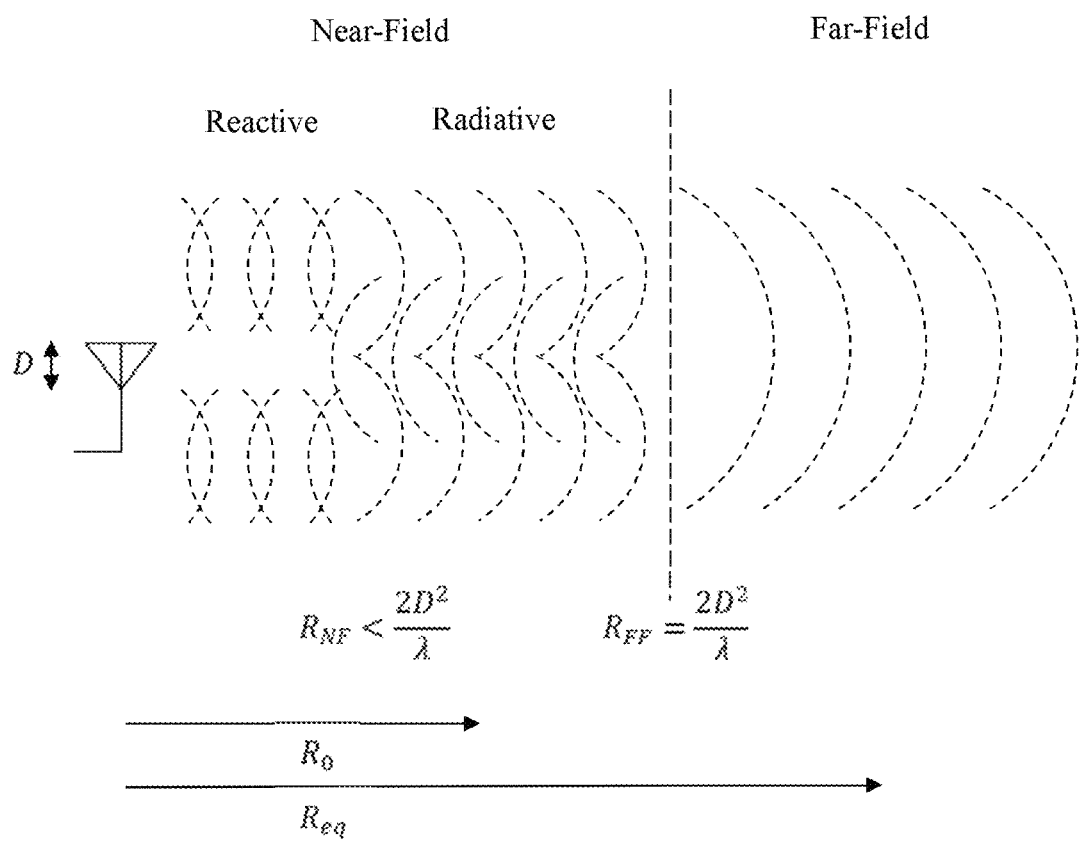
FIG. 1 shows antenna radiation regions in free space by way of an example.

As shown in FIG. 1, an antenna transmitting radio frequency (RF) signals is basically radiating electromagnetic (EM) waves into free space, where the EM field characteristics vary as a function of distance from the radiating antenna.

The antenna radiation region is broadly categorized in two regions, the near-field region and the far-field region.

The near-field region is the region right next to the antenna, which is defined by the distance relationship:

$$R_{NF} < \frac{2D^2}{\lambda}$$

Where,
$R_{NF}$ is the near-field measurement distance from the antenna,
D is the maximum linear dimension of the antenna, and
$\lambda$ is the wavelength of EM waves.

However, in this region, the fields are sort of unpredictable and obscure due to the overlapping and commingling of the reactive field of the antenna.

The far-field region starts from the far-field boundary, which is defined by the distance relationship:

$$R_{FF} = \frac{2D^2}{\lambda}$$

In this region, the EM fields are dominated by radiating fields that are orthogonal to each other and to the direction of propagation as with plane waves. Generally, the OTA measurements are based on far-field region measurements since antennas are usually used to transfer signals at large distances which are considered to be in the far-field region. However, the measurements in the far-field region are required to consider that the distance from the antenna must be much greater than the size of the antenna and the wavelength. Therefore, a direct far-field measurement setup requires a large test environment and severely limits the side lobe level (SLL) accuracy due to the physics of propagation.

Near-field measurements enable antenna probing within the radiative near-field region. For example, U.S. Pat. No. 8,750,354 B1 shows an open architecture design for a digital near-field test system for near-field testing of a phased array antenna that allows the ability to use the components of an individual phased array antenna to be tested in conjunction with a near-field scanner probe.

Figure 2A:
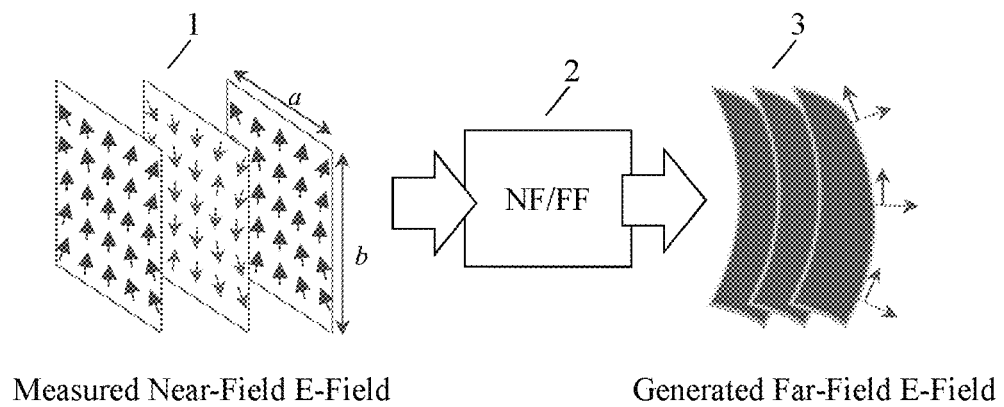
FIG. 2a shows a block diagram of far-field simulation from near-field measurements by way of an example.

One approach to simulate far-field conditions is to measure the antenna in the near-field region and transform the near-field E-field measurements into far-field components. As shown in FIG. 2a, the near-field to far-field transform (NF/FF) test method computes the performance metrics defined for far field by using mathematical near-field to far-field transformations 2. Thus, the antenna radiated near-field beam patterns 1 are measured first. Next these measurements are translated into far-field metrics 3 using the near-field to far-field mathematical transform 2.

Although the aforementioned NF/FF transform test method achieves higher SLL accuracy, the near-field test setup is more complex than the direct far-field measurement and is quite limited in application to OTA measurements as the method requires phase information in addition to the magnitude, thereby arises complexities for measuring modulated signals.

Figure 2B:
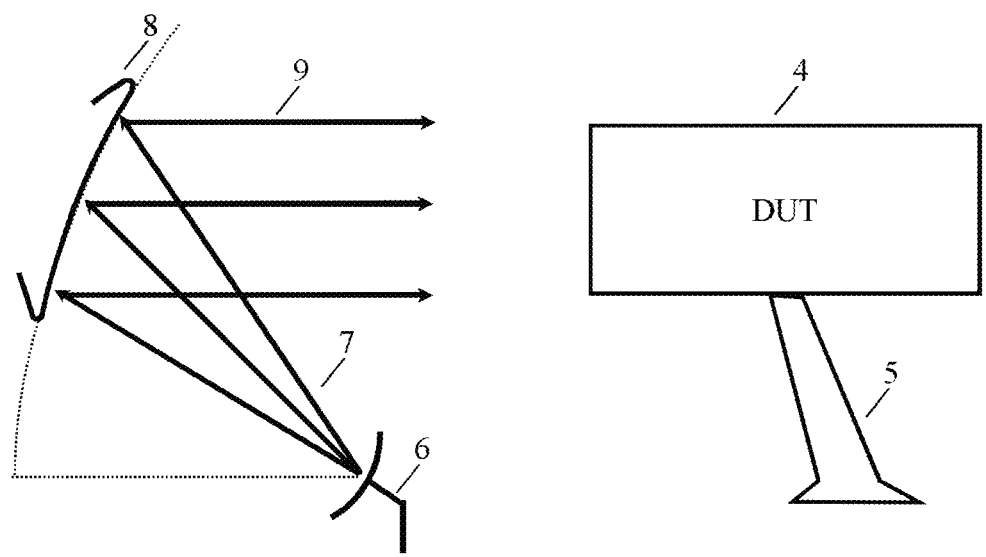
FIG. 2b shows a block diagram of far-field measurement in a CATR environment by way of an example.

Another approach to generate stable far-field conditions is the indirect far-field method that creates the far-field environment using a transformation within the test chamber by means of, for instance, parabolic reflector, Fresnel lens and so on. As shown in FIG. 2b, a CATR test environment is utilizing a parabolic reflector 8 in order to linearize the radiated signals 7, which are transmitted 9 to the device under test (DUT) 4. In the case the DUT 4 radiates a wave front 9 to the reflector 8, the reflector 8 then collimates the radiated spherical wave front into a feed antenna 6. The separation between the DUT 4 and the feed antenna 6 is adequate so that the emanating spherical wave reaches nearly plane phase fronts from the DUT 4 to the feed antenna 6. Usually, the DUT 4 is mounted on a low scattering mount 5.

Although the indirect far-field approach is more complex than the direct far-field approach, the former can perform in a more compact environment and can advantageously deliver good far-field condition with higher SLL accuracy. However, in contrast to the direct far-field approach, it is not possible to simulate near-field conditions from indirect far-field measurements since the far-field distance is seen as the focal length; that is the distance between the feed antenna 6 and the reflector 8. In other words, the near-field simulation requires proper knowledge of the equivalent distance at which the field is measured, which is not available from the indirect far-field measurements.

Hence, the indirect far-field measurement like CATR and near-field measurement approaches are therefore opposed to each other. The indirect far-field approaches indeed allow to create a nice far-field condition in a compact environment and further allow to measure typical quantities looked at in OTA measurements with good accuracy by field magnitude measurements only. On the contrary, near-field measurement approach cannot cover all types of OTA measurements as they require to measure the phase of the electric and/or magnetic field components.

However, if the phase can be measured, the near-field measurement approach can be very beneficial, for instance using near to far-field transformation algorithms the measurements taken in the very proximity of a DUT can be accurately extrapolated to infinity and can yield the most accurate evaluation of far-field patterns especially in null and side lobes. In addition, near to near-field transformation algorithms can also be used and fields measured over a surface surrounding the DUT can be back-propagated towards the DUT so that, for instance, near-field currents can be observed to identify antenna design defects. The back-propagation also facilitates power density assessments in order to evaluate near-field human exposure at mmWave.

Figure 3:
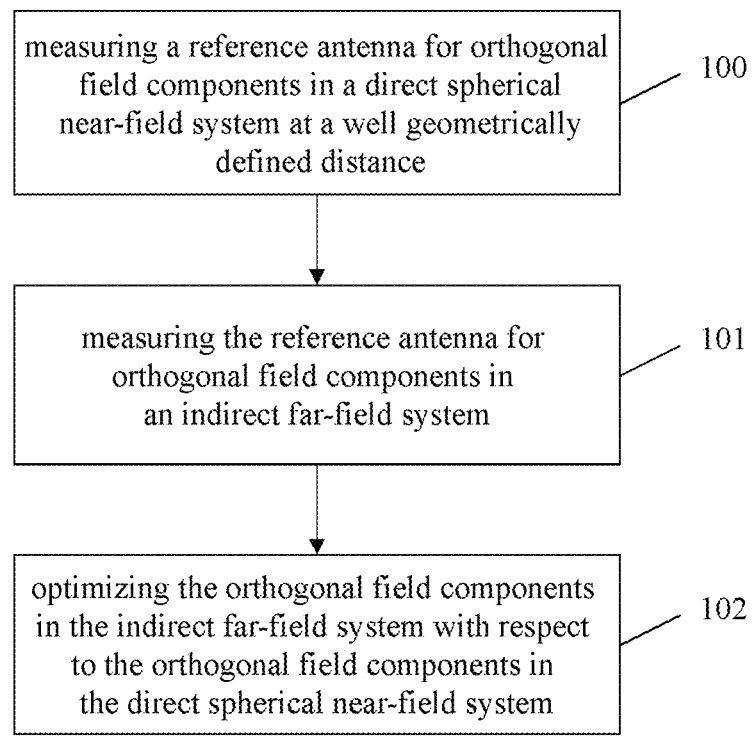
FIG. 3 shows a flow chart of an exemplary embodiment of the inventive method according to the first aspect of the invention.

In FIG. 3, a flow chart of an exemplary embodiment of the inventive method according to the first aspect of the invention is illustrated. In a first step 100, a reference antenna is measured for orthogonal field components in a direct spherical near-field system at a well geometrically defined distance. In a second step 101, the reference antenna is measured for orthogonal field components in an indirect far-field system. In a third step 102, the orthogonal field components in the indirect far-field system are optimized with respect to the orthogonal field components in the direct spherical near-field system.

In addition to this, the inventive method may further comprise the step of applying a Fourier transformation in order to transform the orthogonal field components in the direct spherical near-field system at other distances.

It might be further advantageous if the method further comprises the step of identifying an equivalent distance such that the orthogonal field components measured in the indirect far-field system are closest to the transformed orthogonal field components in the direct spherical near-field system.

Moreover, the method according to the first aspect of the invention may further comprise the step of transforming the orthogonal field components in terms of magnitude and phase by utilizing the equivalent distance of the indirect far-field system.

In addition to this, the inventive method may further comprise the step of calculating near-field currents in the reactive near-field of the reference antenna by forward and/or back propagating the transformed amplitude and phase of the indirect far-field system.

Figure 4:
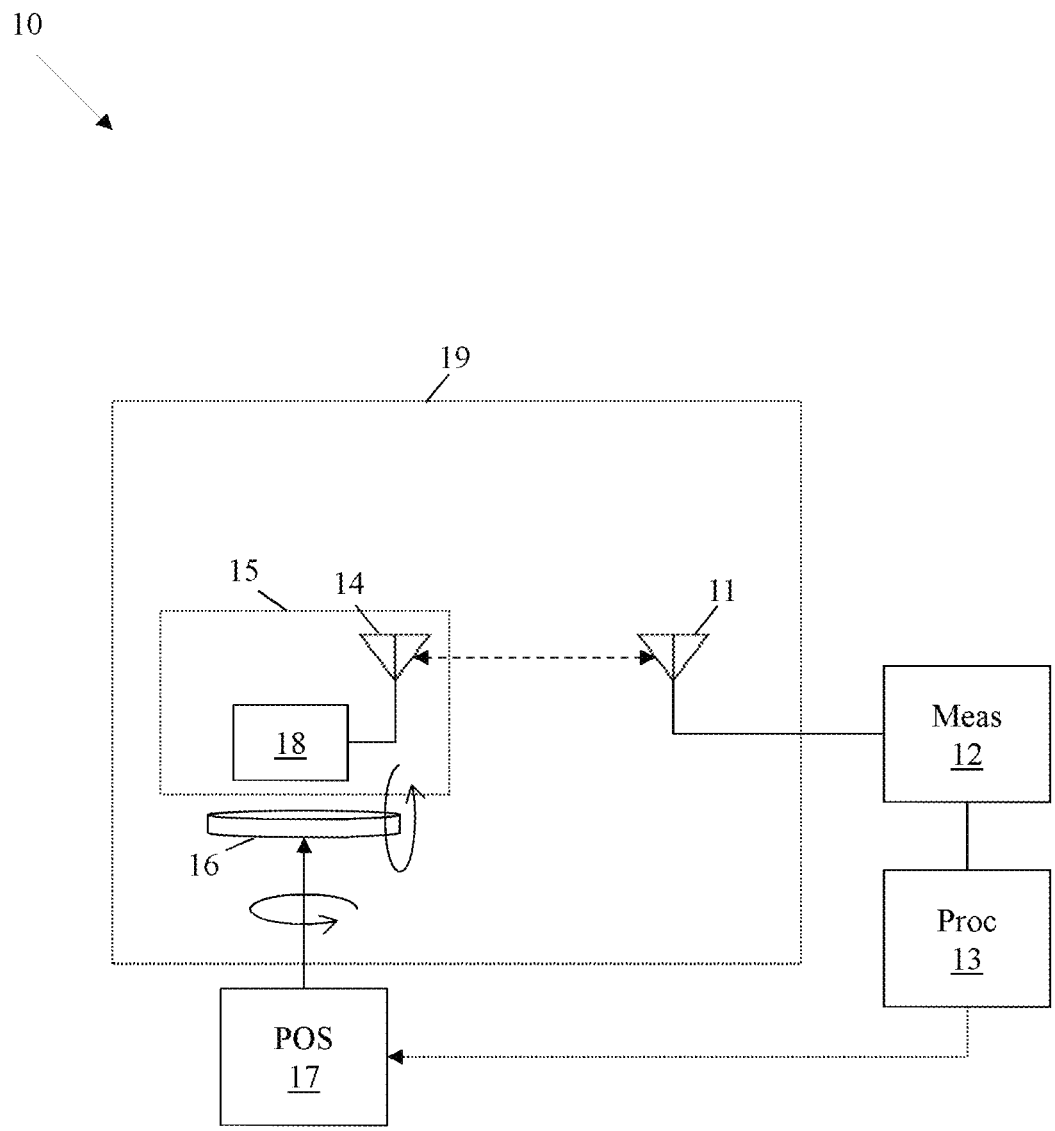
FIG. 4 shows a first exemplary embodiment of the system according to the second aspect of the invention.

In FIG. 4, a first exemplary embodiment of the system 10 according to the second aspect of the invention is illustrated. The system 10 is focused to perform near-field measurements in order to characterize a reference antenna 14 for the two orthogonal field components $E_\theta$, $E_\varphi$. A measuring unit 12 performs measurement on the reference antenna 14 through a measuring antenna 11 at a well-defined distance, for instance $R_0$ as shown in FIG. 1. For post-processing the measurement data, the measuring unit 12 is further connected to a processing unit 13. The connection between the measuring unit 12 and the processing unit 13 is not necessarily required to be a wired connection, a wireless connection in the form of Wireless Local Area Network (WLAN), Web-based interface and so on are also viable. In this context, the processing unit 13 is adapted to apply a Fourier transformation in order to transform the orthogonal field components $E_\theta$, $E_\varphi$ in the near-field system at other distances, for instance at a distance R, where $$R \neq R_0$$

The processing unit 13 advantageously stores the measured as well as extrapolated field components for all distances R, $R_0$.

The reference antenna 14 is conventionally driven by antenna driving circuitry 18, which is closely located to the reference antenna 14 in order to reduce insertion loss and signal degradation. The reference antenna 14 and the antenna drive circuitry 18 may collectively be referred to as a device under test (DUT) 15 such as mobile phones, radio set, short-range devices and the like. The DUT 15 is situated on a turntable 16, which is rotatable along at least two axis by means of a positioning unit 17. The positioning unit 17 can be externally controlled, for instance through control commands inputted and/or generated from the processing unit 13.

The system 10 further comprises an anechoic chamber 19 encompassing the measuring antenna 11, the reference antenna 14, the DUT 15 and the turntable 17.

Figure 5:
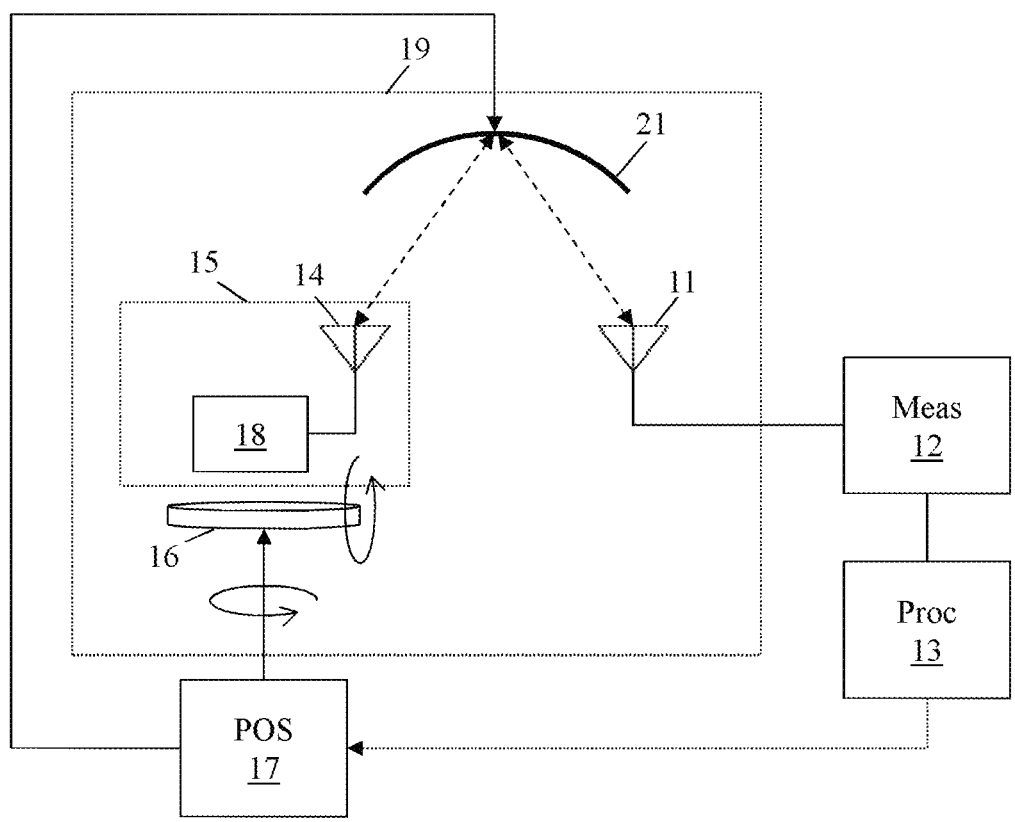
FIG. 5 shows a second exemplary embodiment of the system according to the second aspect of the invention.

In FIG. 5, a second exemplary embodiment of the system 20 according to the second aspect of the invention is illustrated. The system 20 differs from the system 10 of FIG. 4 in that it comprises a shaped reflector 21 in order to perform far-field measurements on the reference antenna 14 for the two orthogonal field components $E_\theta$, $E_\varphi$ and the field pattern. The shaped reflector 21 is preferably a parabolic reflector, which is situated within the anechoic chamber 19 and enables indirect far-field approach to effectively measure the far-field pattern of the DUT 15. In this context, the positioning unit 17 is further adapted to control the spatial position of the shaped reflector 21. Here the processing unit 13 also stores the far-field measurement data.

Figure 6:
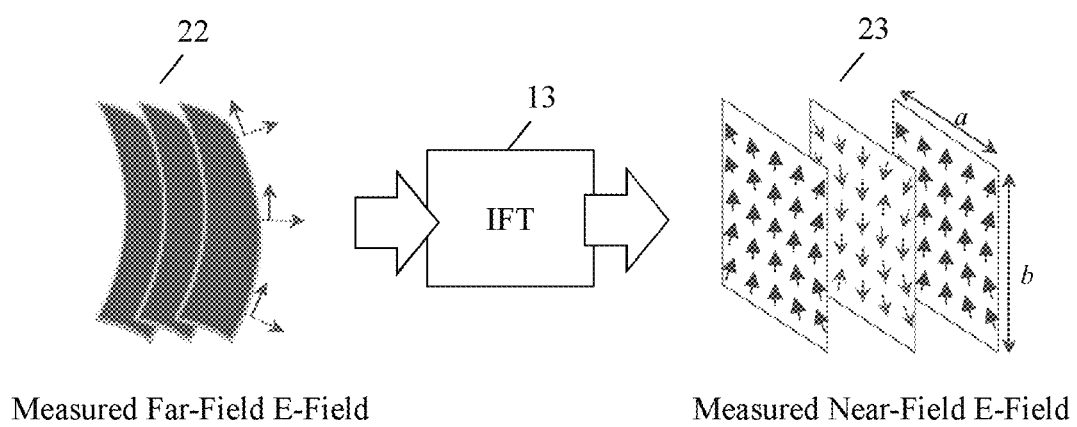
FIG. 6 shows an exemplary block diagram of near-field simulation from far-field measurements according to the second aspect of the invention.

In FIG. 6, an exemplary block diagram of near-field simulation from far-field measurements according to the second aspect of the invention is illustrated. Since the processing unit 13 has already obtained the near-field and far-field measurement data, an optimization of the far-field measurement data 22 is performed with respect to the near-field measurement data 23 according to a certain distance, for instance using $L^2$ norm. An optimization algorithm can be defined based on the following Inverse Fourier Transform:

$$f_{x,y}=A\iint E_{x,y}e^{-jk\cdot r}dxdy$$

Where,
A is the magnitude, and
$e^{-jk\cdot r}$ is the phase, as a function of distance r.

Thus, the distance r can be varied until the result match the near-field measurements for a specific distance, anywhere between R to $R_0$. Consequently, the equivalent distance of the indirect far-field, for instance $R_{eq}$ as shown in FIG. 1, can be identified.

Once the processing unit 13 identifies the equivalent distance of the indirect far-field $R_{eq}$, the field components can be transformed in terms of magnitude and phase and can be forward or back propagated to any other surface using near-field transformation algorithms as following:

$$f_{x,y}=A\iint E_{x,y}e^{+jk\cdot r}dxdy$$

It is particularly advantageous that a simplified near-field transformation algorithm is sufficient to calculate the near-field currents in the reactive near-field of the DUT 15 and further able to calculate the SAR value to evaluate near-field human exposure at mmWave. On the contrary, a conventional near-field probe disrupts the field around the DUT 15 and disadvantageously produces inevitable measurement errors.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What claimed is:

What is claimed is:

1. A method for near-field reconstruction in indirect far-field systems comprising the steps of:
   measuring a reference antenna for orthogonal field components in a direct spherical near-field system at a well geometrically defined distance ($R_0$),
   measuring the reference antenna for orthogonal field components in an indirect far-field system,
   optimizing the orthogonal field components in the indirect far-field system with respect to the orthogonal field components in the direct spherical near-field system; and
   identifying an equivalent distance ($R_{eq}$) such that the orthogonal field components measured in the indirect far-field system are closest to the transformed orthogonal field components in the direct spherical near-field system.

2. The method according to claim 1,
   wherein the method further comprises the step of applying a Fourier transformation in order to transform the orthogonal field components in the direct spherical near-field system at other distances.

3. The method according to claim 1,
   wherein the method further comprises the step of transforming the orthogonal field components in terms of magnitude and phase by utilizing the equivalent distance ($R_{eq}$) of the indirect far-field system.

4. The method according to claim 3,
   wherein the method further comprises the step of calculating near-field currents in the reactive near-field of the reference antenna by forward and/or back propagating the transformed amplitude and phase of the indirect far-field system.

5. A system for near-field reconstruction in indirect far-field systems comprising:
   a measuring antenna,
   a measuring unit, and
   a processing unit,
   wherein the measuring unit is adapted to measure a reference antenna for orthogonal field components in a direct spherical near-field system at a well geometrically defined distance ($R_0$), wherein the measuring unit is further adapted to measure the reference antenna for orthogonal field components in an indirect far-field system, wherein the processing unit is adapted to optimize the orthogonal field components in the indirect far-field system with respect to the orthogonal field components in the direct spherical near-field system, and wherein the processing unit is further adapted to identify an equivalent distance ($R_{eq}$) such that the orthogonal field components measured in the indirect far-field system are closest to the transformed orthogonal field components in the direct spherical near-field system.

6. The system according to claim 5, wherein the processing unit is further adapted to apply a Fourier transformation in order to transform the orthogonal field components in the direct spherical near-field system at other distances.

7. The system according to claim 5, wherein the equivalent distance ($R_{eq}$) corresponds to the equivalent range length of the indirect far-field system.

8. The system according to claim 5, wherein the processing unit is further adapted to transform the orthogonal field components in terms of magnitude and phase by utilizing the equivalent distance ($R_{eq}$) of the indirect far-field system.

9. The system according to claim 8, wherein the processing unit is further adapted to calculate near-field currents in the reactive near-field of the reference antenna by forward and/or back propagating the transformed amplitude and phase of the indirect far-field system.

10. The system according to claim 5, wherein the system further comprises a turntable adapted rotate the reference antenna relative to the measuring antenna along at least two axis.

11. The system according to claim 5, wherein the system further comprises a reflector, preferably a shaped reflector.

12. The system according to claim 5, wherein the system further comprises a positioning unit adapted to control a turntable rotation and the spatial position of a reflector.

13. The system according to claim 5, wherein the system further comprises an anechoic chamber encompassing the reference antenna, the measuring antenna, a turntable and a reflector.

\* \* \* \* \*